United States Patent
Basu et al.

(10) Patent No.: US 10,261,118 B2
(45) Date of Patent: *Apr. 16, 2019

(54) ON-DEMAND DETECTION OF ELECTROMAGNETIC DISTURBANCES USING MOBILE DEVICES

(71) Applicant: International Business Machines Corporation, Armonk, NY (US)

(72) Inventors: Chumki Basu, East Brunswick, NJ (US); Younghun Kim, White Plains, NY (US); Lloyd A. Treinish, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,776

(22) Filed: Feb. 13, 2018

(65) Prior Publication Data

US 2018/0172745 A1   Jun. 21, 2018

Related U.S. Application Data

(63) Continuation of application No. 15/191,812, filed on Jun. 24, 2016, now Pat. No. 9,939,477.

(51) Int. Cl.
*G01R 29/08* (2006.01)
*H04W 4/02* (2018.01)
(Continued)

(52) U.S. Cl.
CPC ..... *G01R 29/0814* (2013.01); *G01R 29/0892* (2013.01); *G08B 21/182* (2013.01);
(Continued)

(58) Field of Classification Search
CPC .......... G01R 29/0814; G01R 29/0892; H04W 4/005; H04W 4/02; H04W 4/021;
(Continued)

(56) References Cited

U.S. PATENT DOCUMENTS 6,072,233 A * 6/2000 Corisis ................ H01L 23/3107
                                                257/685
6,943,454 B1 * 9/2005 Gulachenski ............ G11C 5/02
                                                257/777
(Continued)

OTHER PUBLICATIONS

Appendix P, 2018.

*Primary Examiner* — Orlando Bousono
(74) *Attorney, Agent, or Firm* — Garg Law Firm, PLLC; Grant Johnson

(57) ABSTRACT

A subset of mobile devices is selected from a set of mobile devices located in a local area. From a mobile device in the subset, a magnetic measurement value obtained by performing a magnetic measurement is received. The magnetic measurement value comprises a change in a magnetic property of an immediate surrounding ambient environment of the mobile device. When the magnetic measurement corresponds to a deviation in a network condition in a portion of a network, the portion being located in the local area, a conclusion is output that the deviation is caused by an electromagnetic disturbance (EMD), where an effect of the EMD causes the magnetic measurement value. A notification including an indication of the EMD and an identification of the local area is generated.

20 Claims, 5 Drawing Sheets

(51) Int. Cl.
*H04W 4/70* (2018.01)
*G08B 21/18* (2006.01)
*G08B 29/18* (2006.01)

(52) U.S. Cl.
CPC .......... *G08B 29/185* (2013.01); *H04W 4/023* (2013.01); *H04W 4/70* (2018.02)

(58) Field of Classification Search
CPC ....... H04W 4/023; H04W 4/028; H04W 4/08; H04W 4/70; G08B 21/182; G08B 29/185; H01L 2924/00; H01L 2924/00014; H01L 2924/30107; H01L 2224/4824; H01L 2224/48091; H04M 1/72577
See application file for complete search history.

(56) References Cited

U.S. PATENT DOCUMENTS

| | | | | |
|---|---|---|---|---|
| 2003/0013507 A1* | 1/2003 | Sato | ................ | G01C 17/28 455/575.1 |
| 2006/0255459 A1* | 11/2006 | Muff | ............... | G11C 5/02 257/738 |
| 2008/0248801 A1* | 10/2008 | Fletcher | ................. | H04W 4/02 455/435.2 |
| 2011/0106437 A1* | 5/2011 | Husain | ............... | G08B 21/0236 701/408 |
| 2011/0252054 A1* | 10/2011 | Nielsen | ................... | H04L 67/18 707/770 |
| 2011/0267121 A1* | 11/2011 | Jiles | ....................... | B01J 19/087 327/164 |
| 2012/0276931 A1* | 11/2012 | Nielsen | ................... | H04L 67/18 455/456.3 |
| 2013/0020702 A1* | 1/2013 | Zhai | .................... | H01L 25/0657 257/738 |
| 2013/0285671 A1* | 10/2013 | Hoffman | ............. | G01R 31/027 324/547 |
| 2013/0295968 A1* | 11/2013 | Nielsen | ................... | H04L 67/18 455/456.3 |
| 2013/0308229 A1* | 11/2013 | Faxvog | ................... | H02H 7/04 361/35 |
| 2014/0066090 A1* | 3/2014 | Henderson | ........... | H04W 4/021 455/456.1 |
| 2014/0089422 A1* | 3/2014 | Attalla | .................... | H04W 4/21 709/206 |
| 2014/0128022 A1* | 5/2014 | Anderson | .......... | H04L 12/1475 455/406 |
| 2014/0187220 A1* | 7/2014 | Bond | ................. | H04W 64/006 455/418 |
| 2014/0197905 A1* | 7/2014 | Tsuzuki | ............... | H03H 7/0153 333/174 |
| 2014/0203836 A1* | 7/2014 | Miller | ............. | G01R 31/31816 324/762.01 |
| 2014/0248851 A1* | 9/2014 | Anderson | ........... | H04L 12/1475 455/406 |
| 2014/0310763 A1* | 10/2014 | French | ................... | H04W 12/06 726/1 |
| 2015/0072714 A1* | 3/2015 | Froehlich | .............. | H04W 4/023 455/457 |
| 2015/0074105 A1* | 3/2015 | Ashley | .................... | H04L 47/70 707/736 |
| 2015/0088466 A1* | 3/2015 | Zhang | ................ | G06F 17/5004 703/1 |
| 2015/0131518 A1* | 5/2015 | Nielsen | ................... | H04L 67/18 370/312 |
| 2015/0163624 A1* | 6/2015 | Kreher | .................... | H04W 4/02 455/456.1 |
| 2015/0311697 A1* | 10/2015 | Faxvog | ................... | H02H 7/04 361/35 |
| 2016/0011022 A1* | 1/2016 | Zheng | ................... | G01R 33/00 702/94 |
| 2016/0205509 A1* | 7/2016 | Hopcraft | ............... | H04W 4/028 455/456.1 |
| 2016/0295373 A1* | 10/2016 | Ronen | ................... | H04W 4/029 |
| 2017/0091607 A1* | 3/2017 | Emeis | ................... | G06T 19/006 |
| 2017/0111805 A1* | 4/2017 | Barzegar | .............. | H04B 7/0617 |

* cited by examiner

ON-DEMAND DETECTION OF ELECTROMAGNETIC DISTURBANCES USING MOBILE DEVICES

TECHNICAL FIELD

The present invention relates generally to a method, system, and computer program product for detecting electromagnetic (EM) disturbance. More particularly, the present invention relates to a method, system, and computer program product for on-demand detection of electromagnetic disturbance using mobile devices.

BACKGROUND

Hereinafter, electromagnetic disturbance (EMD) is any natural phenomenon that produces a magnetic change in or around a network such that the magnetic change is sufficient to cause a disturbance, an undesirable operation, or an unintended consequence in the network. Electromagnetic interference (EMI) is an adverse effect caused by an EMD on a network, such as the disturbance, the undesirable operation, or the unintended consequence caused in the network by an EMD. A non-terrestrial EMD is EMD occurring away from the surface of Earth, such as in the upper atmosphere of the planet, in the vacuum of space outside Earth's atmosphere (outer space), or in deep space.

A variety of networks are adversely affected by EMDs. For example, an electrical power distribution network may experience a power surge in a transmission line, a communication network may experience data corruption in a network link, or a control network of other types—such as for controlling a natural gas line, an oil pipeline, water treatment facility, power generation plant, and the like—may experience a disruption or corruption of the signaling.

It is generally understood that an EMD, such as those caused by solar winds or solar storms, corona mass ejection from the sun, supernovae and other cosmic events, and the like, are disruptive to a variety of networks on Earth. The disruptions can range from transient effects to long term or even permanent damage. A transient effect adversely affects a network for a short duration and then allow the network to resume normal operations. An example of a transient effect is a tripped circuit breaker, which can be reset quickly to resume operations.

A long term or permanent damage adversely affects a network in such a way that recovery from the damage takes a significant amount of time and often requires replacement of equipment or reconstruction of a facility. Burnt transformers, burnt boards in data processing systems, burnt power lines are some examples of long term or permanent damage.

SUMMARY

The illustrative embodiments provide a method, system, and computer program product. An embodiment includes a method that selects, from a set of mobile devices located in a local area, a subset of mobile devices. The embodiment receives, from a mobile device in the subset of mobile devices, a magnetic measurement value obtained by performing a magnetic measurement, wherein the magnetic measurement value comprises a change in a magnetic property of an immediate surrounding ambient environment of the mobile device. The embodiment determines whether the magnetic measurement corresponds to a deviation in a network condition in a portion of a network, the portion being located in the local area. The embodiment concludes, responsive to the deviation corresponding with the magnetic measurement, that the deviation is caused by an electromagnetic disturbance (EMD), wherein an effect of the EMD causes the magnetic measurement value. The embodiment generates a notification, the notification comprising an indication of the EMD, and an identification of the local area.

An embodiment includes a computer program product. The computer program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
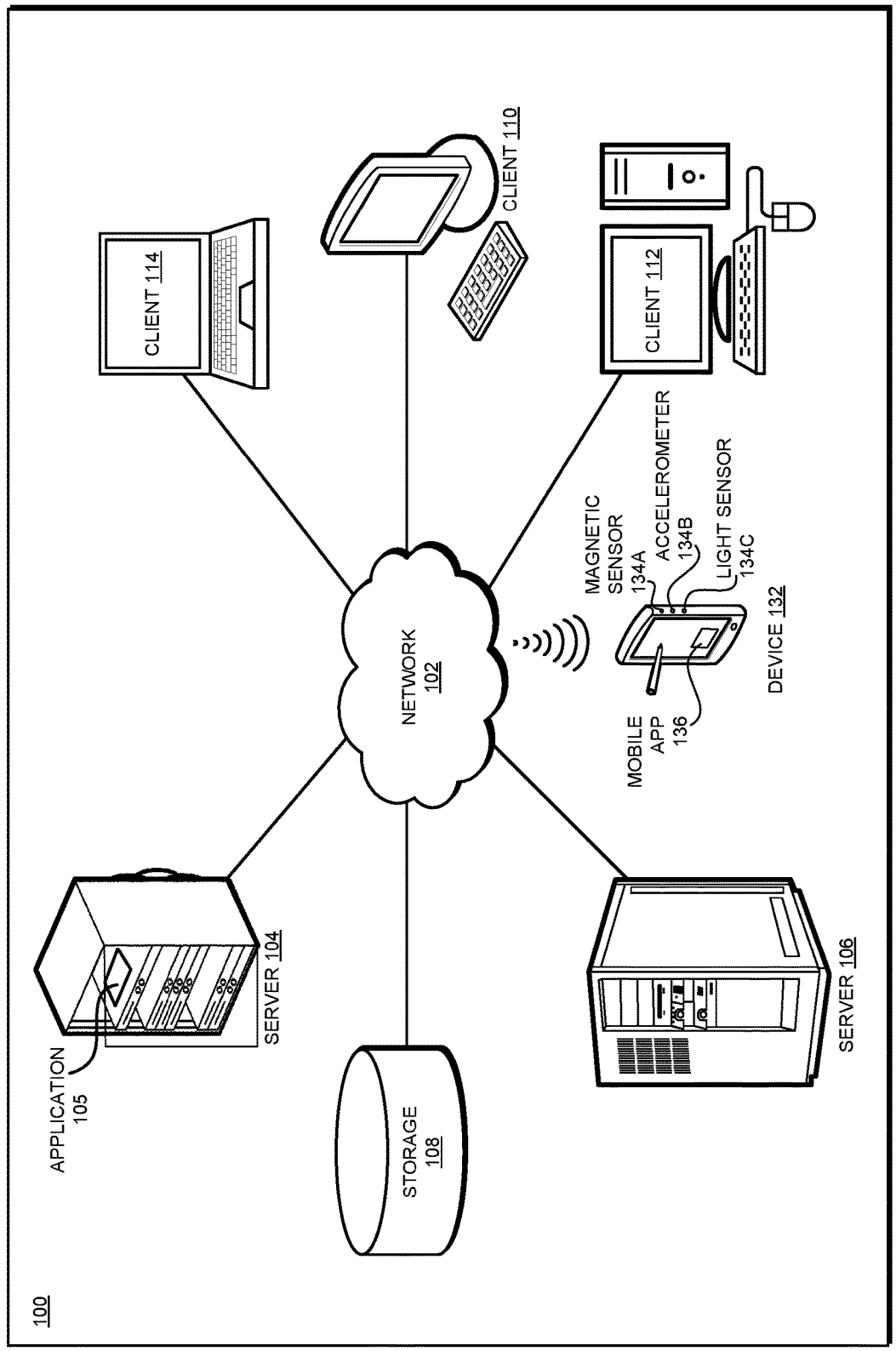
FIG. 1 depicts a block diagram of a network of data processing systems in which illustrative embodiments may be implemented.

The illustrative embodiments recognize that the presently used methods for guarding against EMDs are woefully deficient. For example, a presently used method uses strategically located fixed ground-based equipment for sensing magnetic changes resulting from an EMD. If and when such an equipment produces a detection signal, the detection is generally regarded as a network-wide threat and large portions of the network are either shutdown or placed in a preventative mode to avoid an adverse effect of the EMD.

The illustrative embodiments recognize that due to their fixed locations, a ground-based magnetic sensor may not be close enough to a specific portion of a network, e.g., a specific equipment that may be susceptible to EMI. Because a presently used ground-based fixed sensor may be distant from a portion of a network, the network operators must rely on data that is collected far from the network, and assume that the data is widely applicable from the point of collection to the portion of the network that is susceptible.

Accordingly, when a ground-based fixed sensor detects an EMD, a network operator generally operates large portions of the network in a preventative manner so as to err on the over-cautious side. If the sensor data was localized to the within a specified distance of the susceptible portion or equipment, the network operator can take a more surgical approach and preventatively operate smaller portions of the network. Thus, the illustrative embodiments recognize that the presently collected magnetic data—i.e., data about magnetic changes due to EMDs—is not localized enough for efficient operation of the network when EMDs occur.

The illustrative embodiments further recognize that the network of fixed ground-based sensors is generally operated by a third-party, such as a government agency. It is generally out of the control of a network operator, how the EMD information is collected, processed, and disseminated. In many cases, because the sensors are distributed over a large geographical area, and because a large number of sensors are involved, the amount of time to collect, process, and disseminate the EMD information may be unacceptable for operating a network. For example, where presently a large state-wide portion of a network may have to be shut down or put in a preventative operation mode for many hours or days, a network operator might prefer to selectively shutdown or preventatively operate a city block sized portion or even just a single equipment for a few minutes.

Furthermore, the presently available network of fixed sensors produces EMD information on a generally applicable schedule or based on logic programmed therein. A network operator may want to perform magnetic measurements on-demand in a hyper-localized manner, i.e., very specifically or tightly localized, e.g., within 100 meters of a transformer, and at a time of the operator's choosing, e.g., right now or when a technician is close to the transformer.

The illustrative embodiments used to describe the invention generally address and solve the above-described problems and other problems related to detecting an impending EMD.

An embodiment can be implemented as a software application. The application implementing an embodiment can be configured as a modification of a network management system, as a separate application that operates in conjunction with an existing network management system, a standalone application, or some combination thereof.

An embodiment uses a tiered approach to on-demand detection of EMDs using mobile devices. A spacecraft, such as an artificial satellite operating outside of earth's atmosphere is used in one tier. Any number of spacecrafts operating at various distances from Earth may be used in any number of tiers. For example, a satellite farthest from Earth is likely to detect an EMD, or a precursor thereof, the earliest, and therefore forms the highest tier, e.g., tier 1. Progressively nearer satellites provide correspondingly later information of the detection of the EMD or of a precursor of the EMD. Accordingly, if available, the next farthest satellite in a reducing distance order from Earth forms the next highest tier, e.g., tier 2, and so on. The lowest tier includes a subset of a set of mobile devices, where the subset is located within a local area and capable of operating as described herein.

A local area is a geographical area within a defined distance from a location, e.g., from a location of a portion of a network or from a location of a particular equipment such as a transformer. A mobile device is any portable device capable of being brought into a local area by a user, capable of communicating with another data processing system over a data network, and equipped with at least a magnetic sensor and a location reporting mechanism. A magnetic sensor is a sensor that can detect a change in the ambient magnetism, with a suitable resolution, e.g., a change in magnetic flux density of 0.1 microTesla (µT) or smaller. A location reporting mechanism may include but is not limited to a Global Positioning System (GPS) based location detection or a cellular triangulation based location detection, and reporting of the detected location via a communication module in the mobile device.

An embodiment receives advance information of an EMD event or a precursor of an EMD event. For example, a tier 1 satellite configured to observe the sun detects a corona mass ejection (CME) from the sun. CMEs are known to produce EMDs on Earth under certain circumstances, such as depending upon the direction of the CME relative to Earth's orbit around the sun. An advance information is information received prior to the actual occurrence of the EMD event on Earth. The embodiment thus receives advance information of an impending EMD from a tier 1 satellite or from a ground-based system coupled with the satellite.

The embodiment predicts a time window within which the EMD is likely to occur at a location on earth. The time window can be easily predicted using known distance and measured velocity of an EMD precursor.

The embodiment further predicts a local area that is likely to be affected by the EMD. The local area can be predicted by computing a time of the actual EMD and using computable information about the position of Earth at the time relative to the EMD causing phenomenon.

An embodiment locates a set of mobile devices that are operating or are predicted to be operating in the predicted local area during the predicted time window. For example, a mobile device presently situated in the local area and indicating a movement trajectory that is likely to keep the device in the local area for the next ten minutes is selected in the set if the time window is a three-minute window five minutes from the current time. As another example, a mobile device presently situated outside the local area and indicating a movement trajectory that is likely to bring the device into the local area in the next three minutes is selected in the set if the time window is a three-minute window five minutes from the current time.

These example manners of selecting mobile devices into the set are not intended to be limiting. From this disclosure, those of ordinary skill in the art will be able to conceive many other ways in which a set of suitable mobile devices can be selected, and the same are contemplated within the scope of the illustrative embodiments.

From the selected set of mobile devices, an embodiment selects a subset of devices that the embodiment will use to collect localized data about the magnetic changes in the local area. The subset includes those mobile devices from the set which satisfy one or more conditions for reliable magnetic measurements. For example, a mobile device within the local area, if situated close to or within a Faraday cage, is likely to be less sensitive to small magnetic changes due to an EMD producing non-terrestrial phenomenon. Such a mobile device is therefore not selected into the subset. Similarly, a mobile device traveling within a vehicle at highway speeds is also less likely to reliably detect small magnetic changes at a precise location or within a small area, and is therefore unsuitable for selection in the subset.

Some non-limiting examples of conditions suitable for reliable magnetic measurements, which can be used to select mobile devices into the subset, include, stationary or moving slower than a threshold speed, having a likelihood of remaining in the local area or at a location for at least a threshold amount of time, equipped with a magnetic sensor of sufficient sensitivity or resolution, associated with a person who has consented or who is obligated to using the device for performing the measurement, situated where ambient magnetism from other terrestrial sources is below a threshold value, situated where a structure or device will not prevent accurate measurement of magnetic changes, has been configured to correct for ambient magnetism from terrestrial sources, and many other conditions.

An embodiment collects magnetic data measured by the mobile devices in the subset. The magnetic data is optionally associated with location data about the location where the measurement for the magnetic data was performed. The magnetic data is also optionally associated with time data about the time when the measurement for the magnetic data was performed.

An embodiment also collects network condition data from the EMD-susceptible portion of the network or the equipment that is located in the local area. The network condition data is data that informs about a deviation from a normal operating condition in the portion or equipment. One non-limiting example of network condition data may be a fluctuation in the voltage of a transmission line. When the fluctuation exceeds a threshold fluctuation value, the transmission line operation is regarded as deviating from a normal operating condition. Frequency fluctuations, abnormal operation of current limiters, more than (or less than) a threshold value of reactive power value, and many other conditions in power networks can indicate deviations from normal operations. Similarly, more than a threshold amount of bit-error rate in a memory, checksum mismatch with data in data packets over a network link, and many other conditions in data networks can indicate deviations from normal operations.

These examples of network condition data and deviations are not intended to be limiting. From this disclosure, those of ordinary skill in the art will be able to conceive many other types of network conditions, network condition data, and deviations, and the same are contemplated within the scope of the illustrative embodiments.

An embodiment evaluates a network condition, e.g., an amount of deviation from normal operating conditions, at the portion or the equipment in the local area. The embodiment correlates the evaluation, e.g., the deviation, with the magnetic data collected at the local area. If the correlation indicates that the magnetic variation and the deviation are related, e.g., occurring concurrently, proportional to one another, or related to one another by some relationship, the embodiment concludes that a higher than a threshold likelihood exists that the magnetic variation due to the EMD is a cause of the deviation. Accordingly, the portion or the equipment is in fact susceptible to the EMD.

If the correlation indicates that the magnetic variation and the deviation are not related, e.g., not occurring concurrently, not proportional to one another, or not related to one another by some relationship, the embodiment concludes that a lower than the threshold likelihood exists that the magnetic variation due to the EMD is a cause of the deviation. Accordingly, the portion or the equipment is likely not susceptible to the EMD.

When the portion or equipment at the local area is deemed susceptible to the EMD owing to the correlation, an embodiment outputs a notification. The notification informs a user or a system that an imminent EMD has been affirmatively detected, and that the portion or the equipment is susceptible to that EMD. Based on the notification, a user, such as a network controller or administrator, can take a suitable hyper-localized action on the portion or equipment at the local area.

A method of an embodiment described herein, when implemented to execute on a device or data processing system, comprises substantial advancement of the functionality of that device or data processing system in hyper-localized detection of EMDs. For example, presently available methods for EMDs rely on fixed ground-based sensors, which are not sufficiently near network equipment and which cannot be triggered to collect magnetic data on-demand by network operators. An embodiment provides a method for using mobile devices with built-in magnetic sensors to localize the detection of EMDs and to perform the detection on-demand. This manner of on-demand detection of EMDs using mobile devices is unavailable in the presently available methods. Thus, a substantial advancement of such devices or data processing systems by executing a method of an embodiment is in hyper-localized detection of EMDs such that comparatively small portions of the network or even particular equipment can be isolated for limited shutdown or other preventative measures.

The illustrative embodiments are described with respect to certain types of networks, EMD events, tiers, sensors, magnetic changes, magnetic data, conditions, network conditions, correlations, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
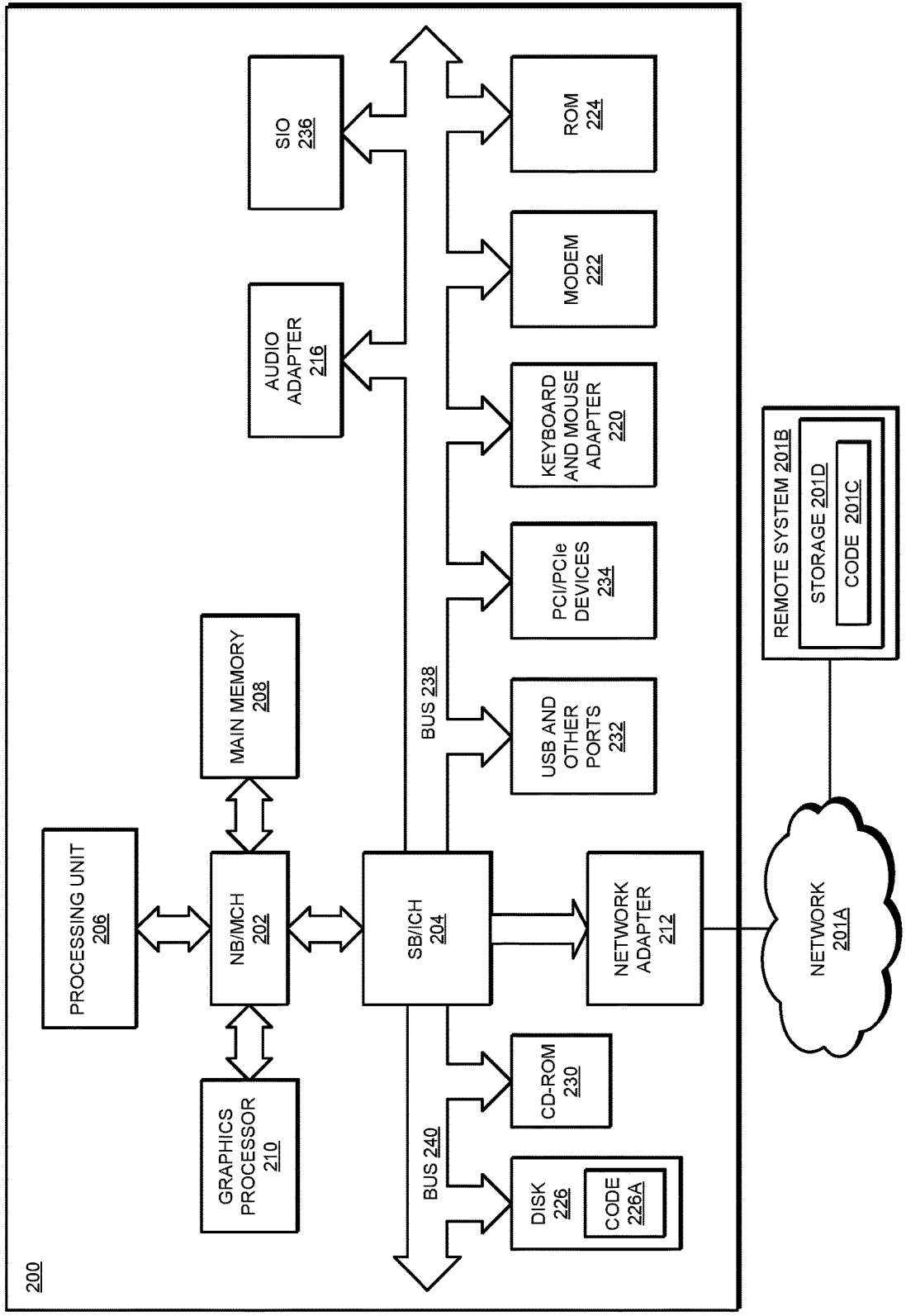
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Device 132 is a mobile device usable in conjunction with an embodiment as described herein. For example, device 132 includes magnetic sensor 134A to sense magnetic changes in the environment immediately surrounding the device. Optionally, accelerometer 134B, light sensor 134C and other sensors or transducers may provide data that is usable in selecting or excluding device 132 from the subset of devices used by an embodiment. Application 105 communicates instructions to device 132 via mobile app 136 on device 132. For example, application 105 requests the location of device 132 via mobile app 136 to determine whether device 132 can be in the set of devices. As another example, application 105 requests data such as ambient conditions, ambient magnetic interference around device 132, the velocity of device 132, and many types of information usable to select or exclude device 132 into the subset. If and when device 132 is selected in the subset, application 105 communicates an instruction to mobile app 136 to collect data about magnetic changes in the vicinity of device 132 and send that data along with optional location and time data to application 105. Mobile app 136 sends the collected magnetic data and any optional data to application 105 via a connection with network 102.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 or mobile app 136 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
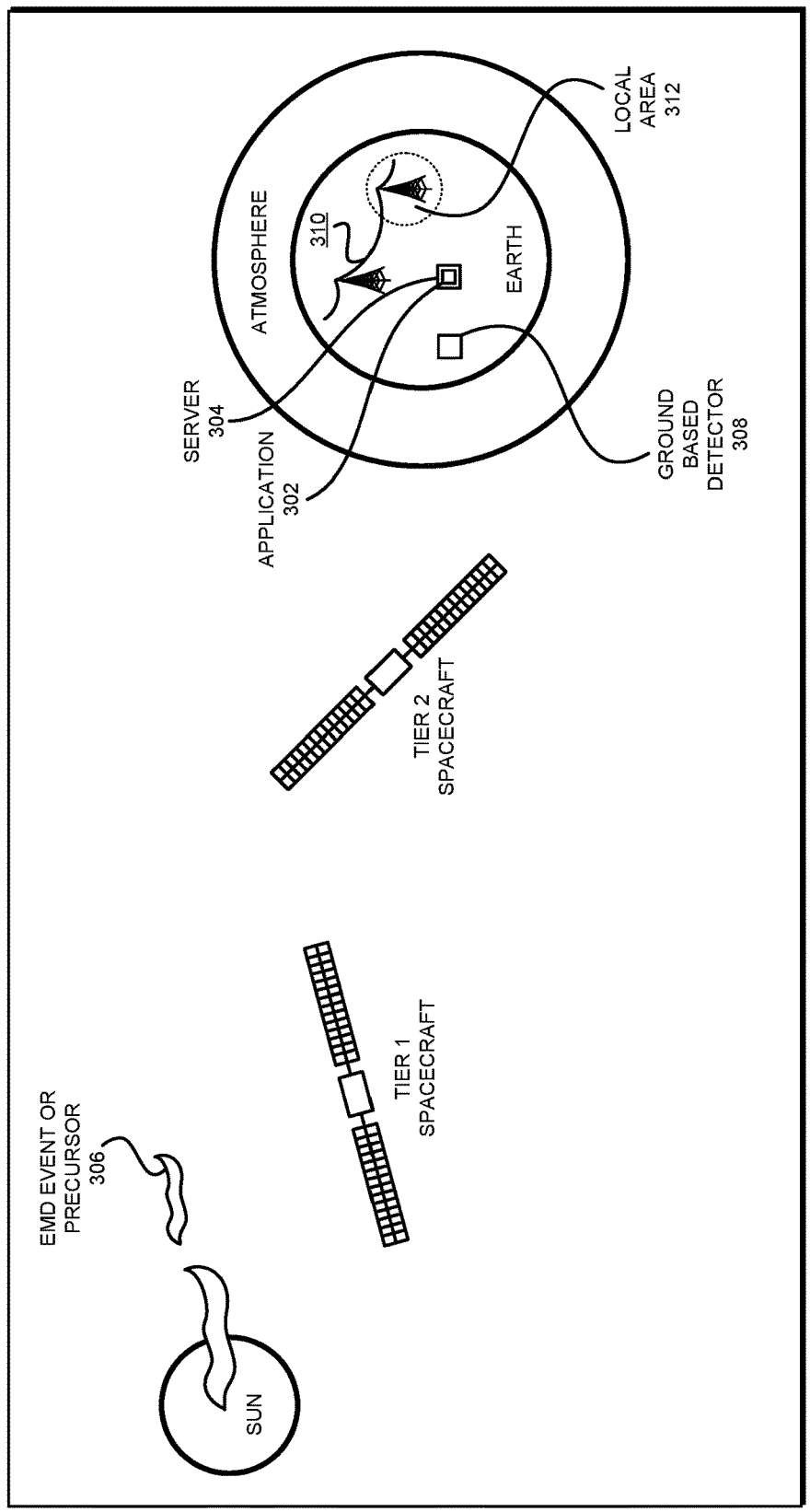
FIG. 3 depicts a block diagram of an example configuration for on-demand detection of EMDs using mobile devices in accordance with an illustrative embodiment.

With reference to FIG. 3, this figure depicts a block diagram of an example configuration for on-demand detection of EMDs using mobile devices in accordance with an illustrative embodiment. Application 302 is an example of application 105 in FIG. 1. Server 304 is an example of server 104 in FIG. 1.

Only as a non-limiting example, assume that the EMD is caused by solar activity on the sun. further assume that two spacecrafts, e.g., sun-monitoring satellites are situated at different distances from Earth, the spacecraft farther from Earth forming a tier 1 spacecraft, and the spacecraft nearer to Earth forming a tier 2 spacecraft.

EMD event 306 or a precursor thereof may originate from the sun and is first detected by tier 1 spacecraft. Tier 1 spacecraft produces advance information about the detection at time T1, which is sometime before EMD event 306 causes an EMD on Earth. In a similar manner, optionally, and when available, any number of other tiers produce advance information about detecting EMD event 306. For example, in the depicted example, tier 2 spacecraft produces advance information about the detection at time T2, which is sometime after T1 and sometime before time T3 when EMD event 306 causes an EMD on Earth.

Assume that advance information from satellites travels faster than EMD event. As an example, solar CMEs are an example of EMD event 306, and the CMEs are known to travel much slower than the speed of light at which the data signals from the satellites can travel back to Earth). Detector 308 is a prior-art ground-based magnetic sensor at a fixed location. Detector 308 will detect EMD event 306 much later than tier 1 spacecraft or tier 2 spacecraft. Advantageously, application 302 executing in server 304 receives the advance information about EMD event 306 from tier 1 spacecraft, tier 2 spacecraft, or both much sooner than detector 308.

Network 310 is a non-limiting example of an electrical power distribution network of transmission lines. Using the advance information, application 302 predicts that local area 312 will likely suffer adverse effects from the EMD that will be caused by EMD event 306. Accordingly, where detector 308 would have caused a shutdown of the entire depicted portion of network 310, application 302 enables identifying the portion or equipment of network 310 that is located within local area 312 as the portion or equipment that will susceptible to EMD event 306 during a time window that includes time T3. Furthermore, application 302 enables this identification sometime before T3.

Figure 4:
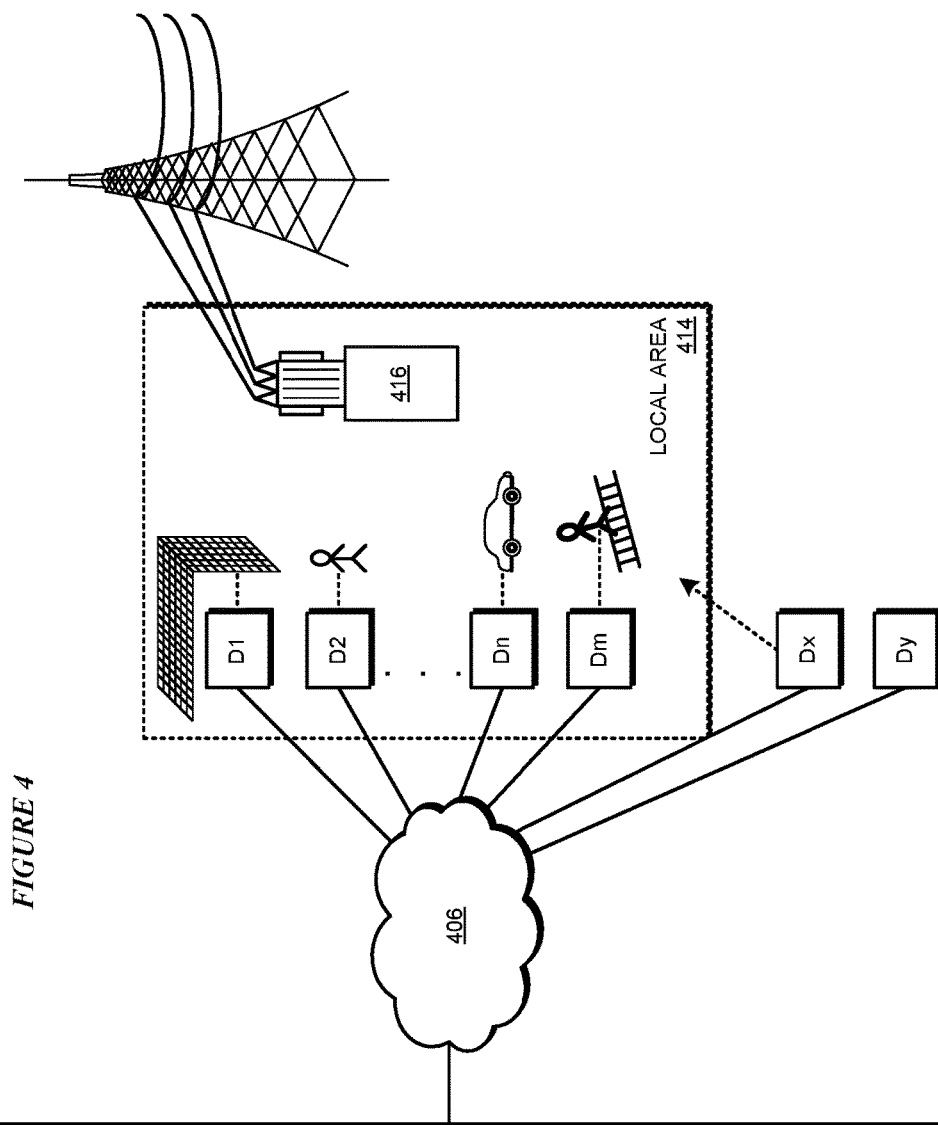
FIG. 4 depicts an example configuration for on-demand detection of EMDs using mobile devices in accordance with an illustrative embodiment.

With reference to FIG. 4, this figure depicts an example configuration for on-demand detection of EMDs using mobile devices in accordance with an illustrative embodiment. Application 402 is an example of application 302 in FIG. 3. Server 404 is an example of server 304 in FIG. 3. Network 406 is an example of network 102 in FIG. 1. Each of devices D1, D2, . . . Dn, Dm, . . . Dx, and Dy is a mobile device as described herein, and is an example of mobile device 132 in FIG. 1.

Component 408 receives advance information of an EMD event or a precursor of an EMD event. Component 408 performs computations to determine whether the advance information reveals a threat of an actual EMD.

If an actual EMD threat exists, component 410 computes a time window during which the EMD is likely to occur. Component 412 computes a local area within which an adverse effect of the EMD will be felt. Local area 414 is an example local area predicted by component 412. Example local area 414 includes equipment 416, and is therefore hyper-localized to just that portion of the network.

Component 418 detects the mobile devices that are available in or around local area 414. For example, based on the location information from several mobile devices received by component 418, component 418 determines that devices D1, D2, Dn and Dm are presently within local area 414 Thus, component 418 constructs a set of devices D1, D2, Dn, and Dm.

Component 420 selects a subset of the set of devices as described herein. Suppose that data from D1 reveals that D1 is in or near a Faraday cage or a similar structure which prevents D1 from making accurate EM measurements. Similarly, suppose that data from D2 reveals that D2 is associated with a substantially stationary user, data from Dn reveals that Dn is associated with a vehicle traveling at a greater-than-a-threshold velocity, and data from Dm reveals that Dm is associated with a technician on site at equipment 416. Component 420 selects devices D2 and Dm into the subset.

In one implementation of an embodiment, device trajectories can be factored into the selection. For example, suppose that in such an implementation, component 418 is configured to detect from device Dx's data that device Dx is likely to travel within local area 414 given device Dx's trajectory. Component 418 determines that Dy is neither in local area 414 nor is likely to be in local area 414. Optionally, in such an implementation of an embodiment, component 418 may also include Dx into the set. In such an implementation of an embodiment, for some similarly determined reasons, Dx may be included in the subset and Dy may be excluded from the subset.

Component 422 collects magnetic data from the selected subset of devices. Optionally, component 422 may also collect location data and time data corresponding to the magnetic data from such devices.

Component 424 receives information about a network condition as described herein. As an example, a system coupled with the network may supply such network condition information to component 424. The network condition data pertains to the portion or equipment of the network that is within local area 414, e.g., equipment 416 in the depicted example. Component 424 evaluates whether the network condition data indicates any deviation from normal operations for such portion or equipment of the network.

As described herein, component 426 correlates the magnetic data from the subset of devices with the evaluated network condition in the portion or equipment within local are 414. If a correlation is found as described herein, component 428 generates a notification about an affirmative detection of an impending EMD which is likely to have an adverse effect on the portion or equipment situated in local area 414.

Figure 5:
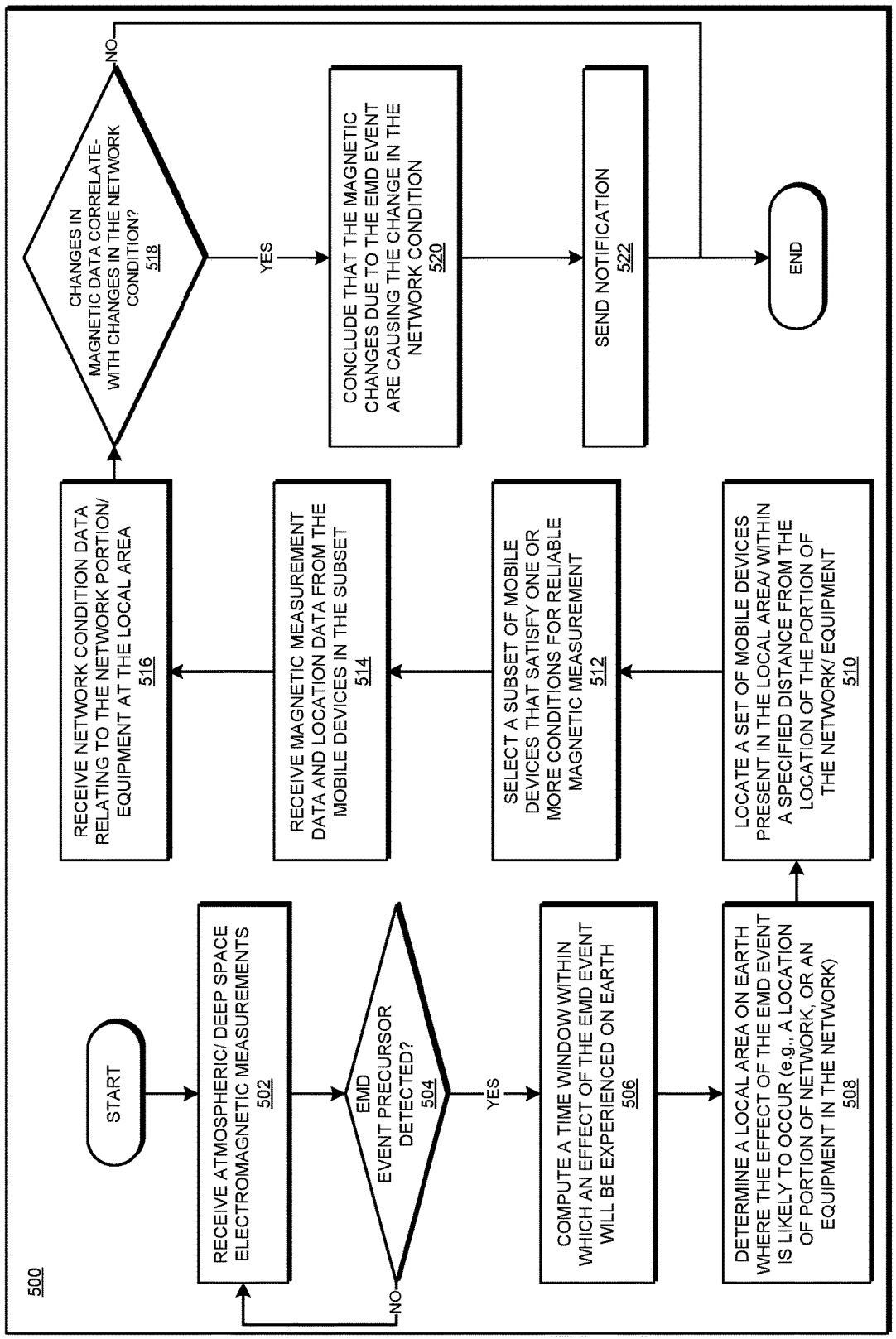
FIG. 5 depicts a flowchart of an example process for on-demand detection of EMDs using mobile devices in accordance with an illustrative embodiment.

With reference to FIG. 5, this figure depicts a flowchart of an example process for on-demand detection of EMDs using mobile devices in accordance with an illustrative embodiment. Process 500 can be implemented in application 402 in FIG. 4.

The application receives advance electromagnetic measurement data from systems observing atmospheric and/or deep space phenomena (block 502). The application determines whether the advance data is indicative of an EMD event or a precursor of an EMD event (block 504). If the advance data is not indicative of an EMD event or a precursor of an EMD event ("No" path of block 504), the application returns to block 502.

If the advance data is indicative of an EMD event or a precursor of an EMD event ("Yes" path of block 504), the application computes a time window within which an effect of the EMD event will be experienced on Earth (block 506). The application also determines a local area on Earth where the effect of the EMD event is likely to occur (block 508). The local area includes a portion or equipment of a network that will be adversely affected by the EMD.

The application locates a set of mobile device present in the local area or within a specified distance of a location of a portion or equipment of the network situated within the local area (block 510). The application selects a subset of those devices from the set, which satisfy one or more conditions for reliable magnetic measurement (block 512).

The application receives magnetic measurement data from the devices in the subset (block 514). Optionally, the application may also receive location information, time information, or both corresponding to the where and when, respectively, the magnetic measurements were made.

The application receives network condition data relating to the network portion or equipment that is situated in the local area (block 516). The application determines whether the changes in the magnetic data correlate with the changes in the network condition within the local area (block 518). Stated another way, at block 518, the application determines whether the magnetic data can be correlated to the network condition data.

If no correlation is established with sufficient confidence ("No" path of block 518), the application ends process 500 thereafter. If a correlation is found with a confidence exceeding a threshold confidence level ("Yes" path of block 518), the application concludes that the magnetic changes due to the EMD event are causing the changes in the network condition (block 520). The application sends a notification about the detection of an impending EMD event at the local area (block 522). The application ends process 500 thereafter.

Thus, a computer implemented method, system or apparatus, and computer program product are provided in the illustrative embodiments for on-demand detection of EMDs using mobile devices and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    obtaining an advance information indicative of an electromagnetic disturbance (EMD) event;
    computing, from the advance information, a local area where an effect of the EMD event is likely to occur;
    selecting a subset of mobile devices located in the local area having a velocity of movement within the local area that is less than a threshold value;
    receiving, from a mobile device in the subset of mobile devices, a magnetic measurement value obtained by performing a magnetic measurement, wherein the magnetic measurement value comprises a change in a magnetic property of an immediate surrounding ambient environment of the mobile device;
    concluding, responsive to a deviation in a network condition in a portion of a network, and responsive to the deviation corresponding with the magnetic measurement, that the deviation is caused by the EMD, the portion being located in the local area; and
    generating a notification, the notification comprising an indication of the EMD, and an identification of the local area.

2. The method of claim 1, further comprising:
    computing, from the advance information, a time window when the effect of the EMD will adversely affect the portion of the network in the local area.

3. The method of claim 2, further comprising obtaining the advance information from a remote sensor, wherein the remote sensor is located on a spacecraft, wherein the spacecraft is configured to monitor cosmic EMD events.

4. The method of claim 1, further comprising:
    receiving network condition data about the portion of the network; and
    computing the deviation using the network condition data, wherein the deviation exceeds a threshold deviation from a normal operating condition in the portion of the network.

5. The method of claim 1, further comprising:
    receiving a location information about a location where the magnetic measurement was performed.

6. The method of claim 1, further comprising:
    receiving a time information about a time when the magnetic measurement was performed.

7. The method of claim 1, wherein the magnetic measurement measures a change in magnetic flux density.

8. The method of claim 1, further comprising:
    determining whether a first mobile device in the set satisfies a condition for reliable magnetic measurement by the first mobile device in the local area; and
    selecting, responsive to the first mobile device satisfying the condition, the first mobile device into the subset of mobile devices.

9. The method of claim 8, wherein the condition comprises:
    being configured to remove an effect of a terrestrial electromagnetic interference on the magnetic measurement.

10. The method of claim 1, further comprising:
    receiving location information from a group of mobile devices;
    selecting from the group of mobile devices those mobile devices that are situated within a specified distance from a location.

11. The method of claim 10, wherein the location is a location of an equipment in the network.

12. The method of claim 11, wherein the network is a power distribution network for distributing electrical power, comprising power transmission lines and power transmission equipment.

13. The method of claim 10, further comprising:
    further selecting, from the group of mobile devices, a mobile device that is at a distance greater than the specified distance from the location but is expected to be within the specified distance of the location within a determined period.

14. The method of claim 1, wherein the method is embodied in a computer program product comprising one or more computer-readable storage devices and computer-readable program instructions which are stored on the one or more computer-readable tangible storage devices and executed by one or more processors.

15. The method of claim 1, wherein the method is embodied in a computer system comprising one or more processors, one or more computer-readable memories, one or more computer-readable storage devices and program instructions which are stored on the one or more computer-readable storage devices for execution by the one or more processors via the one or more memories and executed by the one or more processors.

16. A computer usable program product comprising one or more computer-readable storage devices, and program instructions stored on at least one of the one or more storage devices, the stored program instructions comprising:
  program instructions to obtain an advance information indicative of an electromagnetic disturbance (EMD) event;
  program instructions to compute, from the advance information, a local area where an effect of the EMD event is likely to occur;
  program instructions to select a subset of mobile devices located in the local area having a velocity of movement within the local area that is less than a threshold value;
  program instructions to receive, from a mobile device in the subset of mobile devices, a magnetic measurement value obtained by performing a magnetic measurement, wherein the magnetic measurement value comprises a change in a magnetic property of an immediate surrounding ambient environment of the mobile device;
  program instructions to conclude, responsive to a deviation in a network condition in a portion of a network, and responsive to the deviation corresponding with the magnetic measurement, that the deviation is caused by the EMD, the portion being located in the local area; and
  program instructions to generate a notification, the notification comprising an indication of the EMD, and an identification of the local area.

17. The computer usable program product of claim 16, further comprising:
  program instructions to compute, from the advance information, a time window when the effect of the EMD will adversely affect the portion of the network in the local area.

18. The computer usable program product of claim 17, further comprising:
  program instructions to obtain the advance information from a remote sensor, wherein the remote sensor is located on a spacecraft, wherein the spacecraft is configured to monitor cosmic EMD events.

19. The computer usable program product of claim 16, further comprising:
  program instructions to receive network condition data about the portion of the network; and
  program instructions to compute the deviation using the network condition data, wherein the deviation exceeds a threshold deviation from a normal operating condition in the portion of the network.

20. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
  program instructions to obtain an advance information indicative of an electromagnetic disturbance (EMD) event;
  program instructions to compute, from the advance information, a local area where an effect of the EMD event is likely to occur;
  program instructions to select a subset of mobile devices located in the local area having a velocity of movement within the local area that is less than a threshold value;
  program instructions to receive, from a mobile device in the subset of mobile devices, a magnetic measurement value obtained by performing a magnetic measurement, wherein the magnetic measurement value comprises a change in a magnetic property of an immediate surrounding ambient environment of the mobile device;
  program instructions to conclude, responsive to a deviation in a network condition in a portion of a network, and responsive to the deviation corresponding with the magnetic measurement, that the deviation is caused by the EMD, the portion being located in the local area; and
  program instructions to generate a notification, the notification comprising an indication of the EMD, and an identification of the local area.

* * * * *